United States Patent
Bommer et al.

(10) Patent No.: US 10,585,971 B2
(45) Date of Patent: Mar. 10, 2020

(54) QUALITY FACTOR ESTIMATION OF A REVERBERANT CAVITY

(71) Applicant: The Boeing Company, Chicago, IL (US)

(72) Inventors: Jason P. Bommer, Tacoma, WA (US); Dennis M. Lewis, Mill Creek, WA (US); Genevieve J. Hankins, Brooklyn, NY (US)

(73) Assignee: The Boeing Company, Chicago, IL (US)

( * ) Notice: Subject to any disclaimer, the term of this patent is extended or adjusted under 35 U.S.C. 154(b) by 965 days.

(21) Appl. No.: 13/969,715

(22) Filed: Aug. 19, 2013

(65) Prior Publication Data

US 2015/0051874 A1 Feb. 19, 2015

(51) Int. Cl.
| | |
|---|---|
| G06F 17/10 | (2006.01) |
| H04B 17/309 | (2015.01) |
| G01R 27/26 | (2006.01) |
| G01R 31/00 | (2006.01) |
| G01R 29/08 | (2006.01) |

(52) U.S. Cl.
CPC ......... G06F 17/10 (2013.01); G01R 27/2688 (2013.01); H04B 17/309 (2015.01); G01R 29/0814 (2013.01); G01R 31/008 (2013.01)

(58) Field of Classification Search
CPC .......................... G01R 27/2688; G01R 31/008
See application file for complete search history.

(56) References Cited

U.S. PATENT DOCUMENTS

| | | | | |
|---|---|---|---|---|
| 3,506,220 A | * | 4/1970 | Sbrilli | B64C 39/005 244/19 |
| 3,506,224 A | * | 4/1970 | Harr | B64D 37/06 220/560.11 |
| 8,499,631 B2 | * | 8/2013 | Bommer | G01M 5/0091 356/480 |
| 2008/0127756 A1 | | 6/2008 | Horton et al. | |
| 2009/0205429 A1 | * | 8/2009 | Bommer | G01M 5/0091 73/634 |

(Continued)

FOREIGN PATENT DOCUMENTS

| | | | | |
|---|---|---|---|---|
| WO | 2009055218 A2 | 4/2009 | | |
| WO | WO 2009055218 A2 | * | 4/2009 | ............. G01N 22/02 |

OTHER PUBLICATIONS

Pirkl et al., "Reverberation Chamber Measurement Correlation," IEEE Transactions on Electromagnetic Compatibility, vol. 54, No. 3, Jun. 1, 2012, pp. 533-545.

(Continued)

*Primary Examiner* — Lina M Cordero
(74) *Attorney, Agent, or Firm* — Miller, Matthias & Hull LLP (57) ABSTRACT

A method comprises collecting a data set of field characterization measurements at a location inside a reverberant cavity excited by signals having multiple discrete electromagnetic frequencies; and performing a number (n) of circular shifts on the data set by a frequency step ($\Delta f$) and computing a covariance-based coefficient at each shift until the coefficient indicates a lack of correlation. The method further comprises computing a quality factor (Q) of the reverberant cavity as $fc/(\Delta f \times n)$, where fc is center frequency of the data set.

20 Claims, 4 Drawing Sheets

(56) References Cited

U.S. PATENT DOCUMENTS

2010/0014571 A1*  1/2010  Horton ............... H04B 7/18506
                                                              375/227
2012/0067872 A1   3/2012  Libman et al.
2012/0158321 A1*  6/2012  Bommer ............. G01F 23/0084
                                                               702/55

OTHER PUBLICATIONS

Ryan J. Pirkl, "Spatial Autocovariances of Scattering Parameters Measured in a Lossy Reverberation Chamber," IEEE Transactions on Electromagnetic Compatibility, vol. 55, No. 4, Aug. 1, 2013, pp. 671-682.

Crawford et al., "Band-Limited, White Gaussian Noise Excitation for Reverberation Chambers and Applications to Radiated Susceptibility Testing," Nist Technical Note 1375, National Institute of Standards and Technology (Jan. 1996).

Hill et al., "Aperture Excitation of Electrically Large, Lossy Cavities," Nist Technical Note 1361, National Institute of Standards and Technology (Sep. 1993).

David A. Hill, "Electromagnetic Theory of Reverberation Chambers," Nist Technical Note 1506, National Institute of Standards and Technology Dec. 1998).

European Office Action related to Application No. 14180374.2-1568 reported on Sep. 26, 2017.

Office Action for related Chinese Application No. 201410401344.3; report dated Oct. 20, 2017.

Office Action for related Chinese Application No. 201410401344.3; report dated May 9, 2018.

\* cited by examiner

QUALITY FACTOR ESTIMATION OF A REVERBERANT CAVITY

BACKGROUND

Quality factor (Q) of a large reverberant cavity may be used to describe the ability of the cavity to store energy. Higher Q indicates a lower rate of energy loss relative to the stored energy.

An analytical expression for Q of a simple cavity may be based on a mathematical model of volume, surface area, and wall conductivity. Complex cavities, however, may be extremely difficult to model mathematically. For instance, a complex cavity may be difficult to characterize in terms of true volume. In addition, losses may be difficult to estimate. Consequently, Q of a complex cavity may be difficult to determine.

SUMMARY

According to an embodiment herein, a method comprises collecting a data set of field characterization measurements at a location inside a reverberant cavity excited by signals having multiple discrete electromagnetic frequencies. The method further comprises performing a number (n) of circular shifts on the data set by a frequency step ($\Delta f$) and computing a covariance-based coefficient at each shift until the coefficient indicates a lack of correlation; and computing a quality factor (Q) of the reverberant cavity as $fc/(\Delta f \times n)$, where fc is center frequency of the data set.

According to another embodiment herein, an aircraft comprises a plurality of structures with complex reverberant cavities, a plurality of antennas in the cavities, and aircraft avionics for using the antennas to excite the cavities with signals having multiple discrete electromagnetic frequencies and obtain data sets of field characterization measurements for each cavity. For each data set, the avionics performs a number (n) of circular shifts on the data set by a frequency step ($\Delta f$) and computes a covariance-based coefficient at each shift until the coefficient indicates a lack of correlation. The avionics then computes a quality factor (Q) at the location as $fc/(\Delta f \times n)$, where fc is a data set center frequency.

According to another embodiment herein, a network analysis machine for analyzing a reverberant cavity comprises a signal generator for generating signals on first and second ports that excite the cavity at multiple discrete electromagnetic frequencies; a receiver for reading signals on the first and second ports; and a processor programmed to process the received signals to collect a data set of power measurements at the location. The processor is further programmed to perform a number (n) of circular shifts on the data set by a frequency step ($\Delta f$) and compute a covariance-based coefficient at each shift until the coefficient indicates a lack of correlation; and compute a quality factor (Q) of the reverberant cavity as $fc/(\Delta f \times n)$, where fc is a center frequency of the data set.

These features and functions may be achieved independently in various embodiments or may be combined in other embodiments. Further details of the embodiments can be seen with reference to the following description and drawings.

DETAILED DESCRIPTION

Figure 1:
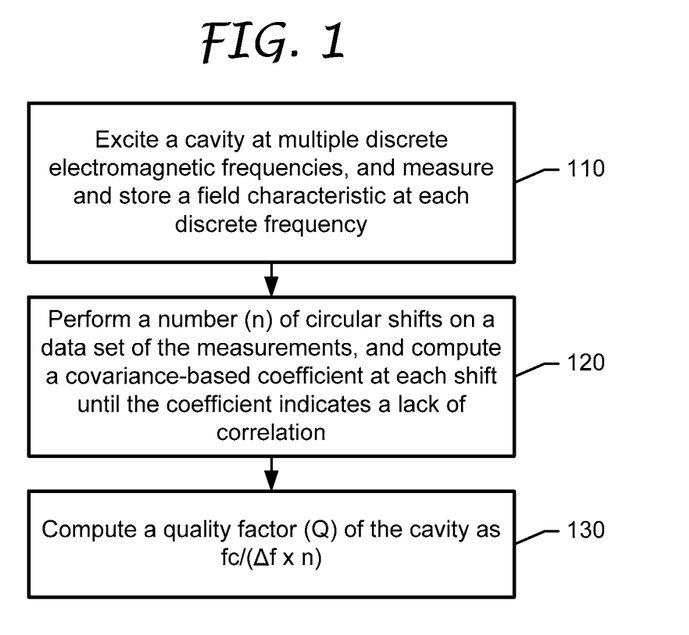
FIG. 1 is an illustration of a method for estimating Q of a reverberant cavity.

Reference is made to FIG. 1, which illustrates a method of estimating quality factor (Q) of a reverberant cavity that may be simple or complex. The cavity's interior surfaces reflect electromagnetic waves and exhibit resonance or resonant behaviour at resonant frequencies. As used herein, the term "resonant mode bandwidth" refers to frequency separation between independent modes.

At block 110, a cavity is excited by signals having multiple discrete electromagnetic frequencies that are separated by a constant frequency step ($\Delta f$). At each frequency, an excitation signal is applied and removed, and the resulting electromagnetic field is allowed to decay before moving on to the next frequency. The frequencies may be increased sequentially. That is, the cavity may be excited by the following sequences of frequencies: $f_{start}$, $f_{start}+\Delta f$, $f_{start}+2\Delta f$, $f_{start}+3\Delta f$, ... $f_{end}$, where $f_{start}$ and $f_{end}$ are the starting and ending excitation frequencies. Wavelength ($\lambda$) of the excitation is $\lambda=v/f$, where v is the speed of propagation in the cavity, and f is the excitation frequency. The smallest dimension of the cavity is more than one wavelength. The value of $\Delta f$, that is, the separation of discrete frequencies, may be at least 10 times smaller than estimated resonant mode bandwidth of the cavity. As will be seen below, a $\Delta f$ that is 100 times smaller will result in a higher resolution estimate of Q than a $\Delta f$ that is 10 times smaller.

Also at block 110, measurements that characterize the electromagnetic field in the cavity are taken and stored. Examples of field characterization measurements include, but are not limited to, measurements of power, voltage, current and impedance. Each measurement may be taken after the field has built up and reached steady state. After $f_{end}$ has been measured and stored, there is data set of field characterization measurements corresponding to different discrete frequencies.

At block 120, a number (n) of circular shifts is performed on the data set by the frequency step ($\Delta f$), and a covariance-based coefficient is computed at each shift until the coefficient indicates a lack of correlation. The lack of correlation indicates the difference between the shifted data set and when compared to the original data set.

The covariance-based coefficient may be a correlation coefficient. In some instances, the covariance-based coefficient may be a Pearson product-moment correlation coefficient.

The lack of correlation may be determined by comparing the coefficient to a threshold. As but one example, the shifts are performed until the coefficient is less than (1/e).

At block 130, a quality factor (Q) of the reverberant cavity is computed as $fc/(\Delta f \times n)$. The product ($\Delta f \times n$) is equivalent to the resonant mode bandwidth. The resonant mode bandwidth indicates separation cavity modes in frequency.

Figure 3A:
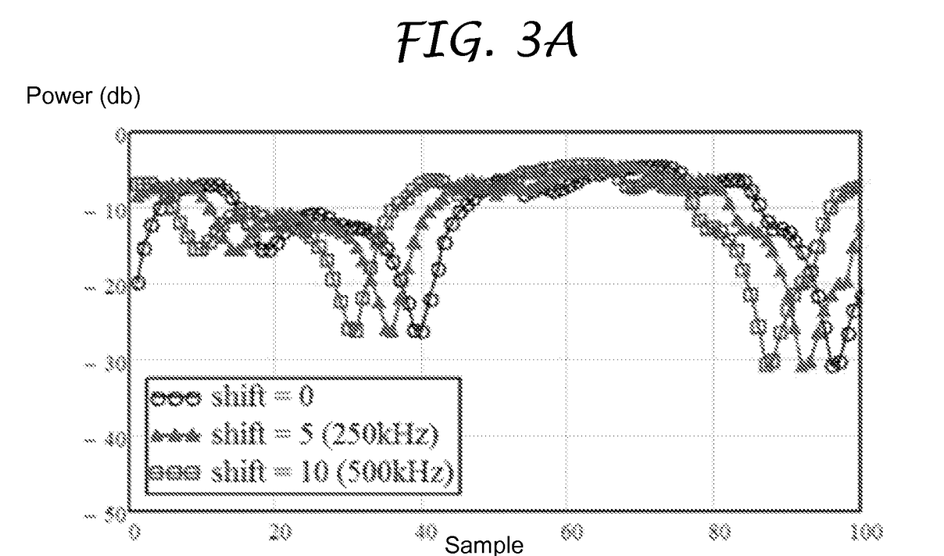
FIG. 3A is an illustration of circular shifting of an original data set of measurements.

Reference is made to FIG. 3A, which illustrates an example of an original data set of power measurements at discrete frequencies. The data set includes a total of 100 samples. The fixed bandwidth between samples is $\Delta f=50$ KHz. Unshifted samples (i.e., samples of the original data set) are denoted by circles (O).

FIG. 3A also illustrates a circular shift of the original data set. Samples shifted n=5 times are denoted by stars (☆). Samples shifted n=10 times are denoted by boxes (□). For each circular shift, all samples are shifted left, and the first sample is moved to the last position. Consider the data set $S_0, S_1, \ldots S_{100}$. For a single shift (n=1), the shifted data set becomes $S_1, S_{100}, S_0$. For a second shift (n=2), the shifted data set becomes $S_2, \ldots S_{100}, S_0, S_1$. Although FIG. 3A illustrates a left circular shift, a right circular shift may be used instead.

Figure 3B:
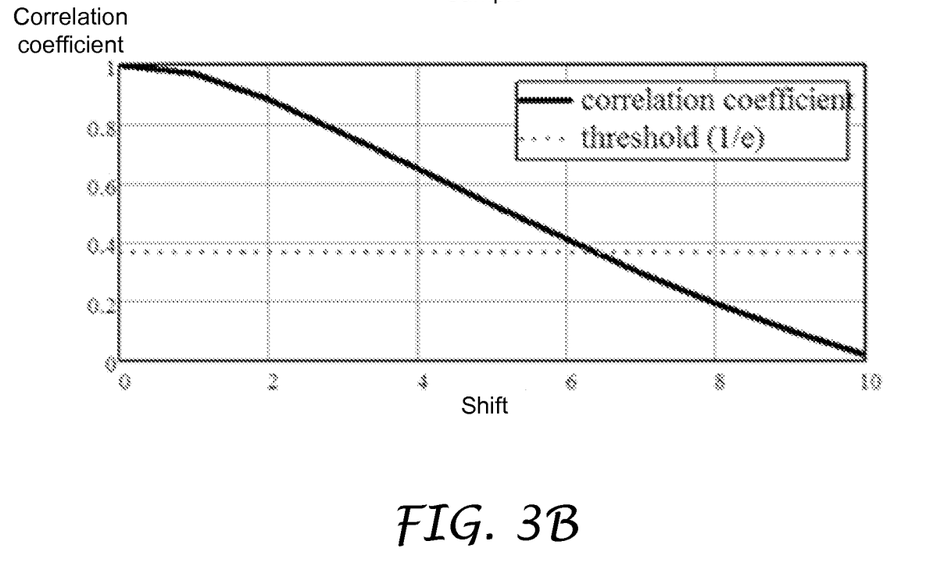
FIG. 3B is an illustration of correlation of the circular-shifted data set to the original data set.

FIG. 3B illustrates correlation of the shifted data sets to the original data set. When n=7, the correlation coefficient <(1/e).

For the example of FIGS. 3A-3B, $Q=f_c/(350 \text{ KHz})$. This example uses a 50 KHz frequency step. Had a smaller step been used (e.g., 5 KHz), between 60 and 70 shifts would have been performed, but the resolution of the estimate would have been higher, and the lack of correlation would have been indicated closer to 60 than 70.

The excitation may be transmitted and measurements taken by one or more antennas in the cavity. For a simple cavity in which fields are uniformly distributed, measurements may be taken at a single location. For complex cavities, multiple measurements may be taken at different locations in the cavity.

The method of FIG. 1 provides a simple way of estimating Q of a cavity that is extremely difficult to model mathematically. There is no need to compute geometry volume or surface area, or estimate losses. The method can estimate Q for cavities having complex shapes and properties (e.g., walls made of different materials and thickness, coupling that is difficult to measure, loss mechanisms that are dynamic, apertures varying in size and space, etc.

Figure 2:
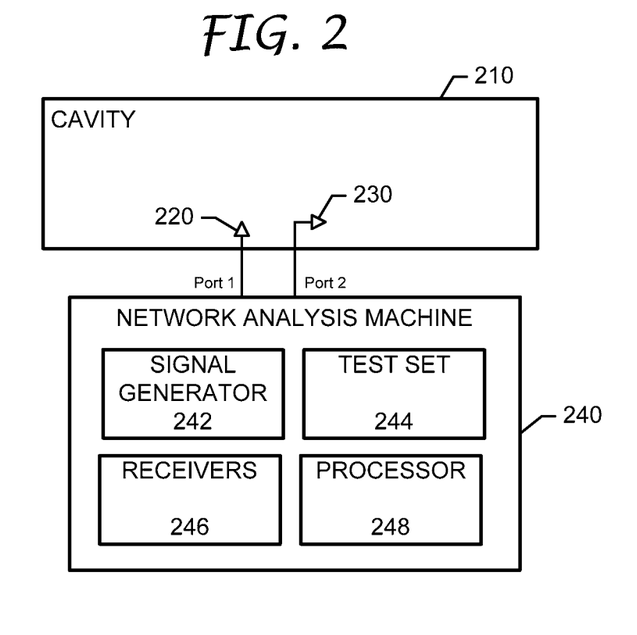
FIG. 2 is an illustration of a system for estimating Q of a reverberant cavity.

Reference is now made to FIG. 2, which illustrates a reverberant cavity 210 including a first antenna 220 and a second antenna 230 at a location inside the cavity 210. Each antenna 220 and 230 can transmit and receive. The antennas 220 and 230 may be arbitrarily located, but it is preferred that the line of sight component connecting the two antennas 220 and 230 is eliminated so that only multipath components are efficiently coupled. For example, directional antennas may be pointed away from each other with cross-align polarity so that they are orthogonal (90 degrees).

Ports 1 and 2 of a network analysis machine 240 may be coupled to the antennas 220 and 230. The network analysis machine 240 may include a signal generator 242, a test set 244, one or more receivers 246, and a processor 248. The signal generator 242 generates signals having multiple discrete frequencies, and the test set 244 routes the signals from the signal generator 242 to ports 1 and 2. The test set 244 also routes the received signals from ports 1 and 2 to the receivers 246. The receiver 246 measures transmitted energy. The processor 248 creates the data set and computes Q according to blocks 120 and 130 of FIG. 1.

For instance, the machine 240 may measure s-parameters at each frequency step by (1) transmitting and then receiving with the first antenna 220; (2) transmitting with the first antenna 220 and receiving with the second antenna 230; (3) transmitting with the second antenna 230 and receiving with the first antenna 220; (4) transmitting and then receiving with the second antenna 230; then (5) computing the s-parameter coefficients $S_{11}$, $S_{12}$, $S_{21}$, and $S_{22}$; and (6) computing the power at each discrete frequency step based on the transmission coefficient $S_{21}$ for gain/loss. As but one example, power may be computed as $(|S_{21}|)^2$, which is the magnitude of the square of transmission coefficient $S_{21}$.

The network analysis machine 240 may be a commercial off-the-shelf network analyzer that generates s-parameters in a conventional manner, but is modified to perform the functions at block 120 and 130. However, the network analysis machine 240 is not limited to a network analyzer. As a first example the network analysis machine 240 may be a received signal strength indicator (RSSI) that is modified to perform the functions at blocks 120 and 130. The modified RSSI can compute Q in addition to computing signal strength at a location in a wireless network.

As a second example, the network analysis machine 240 may include a signal generator for generating test signals, and a spectrum analyzer or field probe for analyzing the responses and also performing the functions at block 120 and 130.

The 2-port network analysis machine 240 of FIG. 2 may be used to estimate Q of a simple cavity in which fields are uniformly distributed. The network analysis machine 240 may estimate Q between port 2 and port 1. Since the cavity has a simple geometry, the port 2 antenna may be located anywhere within the cavity, and the same Q will be estimated. (Analysis of the simple cavity may instead by performed by a one-port machine with a single antenna and time gating to isolate the transmit signal and receive signals.)

The 2-port network analysis machine 240 of FIG. 2 may also be used to estimate Q of a complex cavity in which the electromagnetic fields are not uniformly distributed. For complex cavities in which Q varies spatially, multiple measurements may be taken at different locations in the cavity. The port 2 antenna may be moved to multiple locations, and the functions of blocks 110-130 are performed at each location.

Instead of moving the port 2 antenna, an n-port analysis machine may be used, where n>3. All n antennas may be placed in different areas of interest within the complex cavity. A higher resolution estimate of Q as a whole may be computed since spatial sampling is being increased. For instance, Q34 could be the Q as estimated from transmitting from port 4 and receiving into port 3, and so on.

The method of FIG. 1 is not limited to performing circular shifts on the entire data set. Segments of the discrete frequency bandwidth measurements may instead be used for circular shifting. For example, the entire data set contains power measurements taken over $f_{start}$ to $f_{end}$ at steps of $\Delta f$. However, only a certain frequency is of interest. To estimate Q at the frequency of interest, a segment size might be 5% of the entire data set, with the frequency of interest at the center of the segment.

Figure 4:
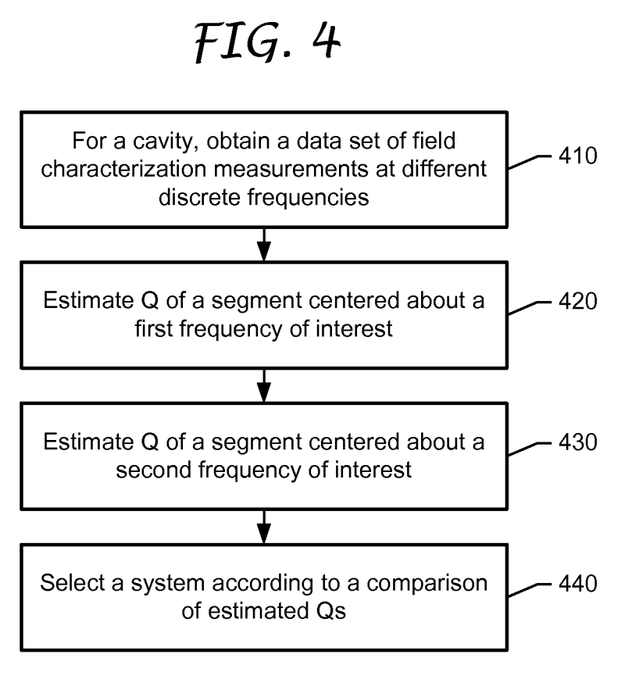
FIG. 4 is an illustration of a method of estimating and using Q of segments of a larger data set.

Reference is now made to FIG. 4, which illustrates a method of using segments of an entire data set to select a wireless system for operation within a cavity. Two wireless systems are considered: an RFID system having a carrier frequency at 915 MHz, and a WiFi system having a carrier frequency of 2.45 GHz.

At block 410, a data set of field characterization measurements corresponding to different discrete frequencies is obtained for the cavity. For example the entire data set contains field characterization measurements taken over $f_{start}=500$ MHz to $f_{end}=60$ GHz at $\Delta f=50$ KHz.

At block 420, Q of a segment centered at a first frequency of interest is estimated. This segment may be centered at fc=915 MHz, which corresponds to the carrier frequency of the RFID system.

At block 430, Q of a segment centered at a second frequency of interest is estimated. This segment may be centered at fc=2.45 GHz, which corresponds to the carrier frequency of the WiFi system.

At block 440, a system is selected according to the comparison of the estimated Qs. Moreover, the selected system may be configured according to its estimated Q.

The method of FIG. 1 may be used to estimate Q of a simple reverberant cavity. However, the power of the method of FIG. 1 lies with its ability to estimate Q for complex cavities. The complex cavity may be difficult to characterize in terms of true volume, it may have loss mechanisms that are difficult to estimate (e.g., due to mixed or unknown material types, leakage through apertures), and it may couple into neighbouring environments such as adjacent cavities and semi-enclosed volumes. In addition, Q of the complex cavity may vary spatially.

The method of FIG. 1 is not limited to any particular type of structure having a complex cavity. Examples of three structures will now be described.

The first and second examples are aircraft structures. A large (e.g., commercial) aircraft includes a variety of structures having arbitrary shapes or partitions within larger cavities that are difficult to characterize in terms of true volume.

Figure 5:
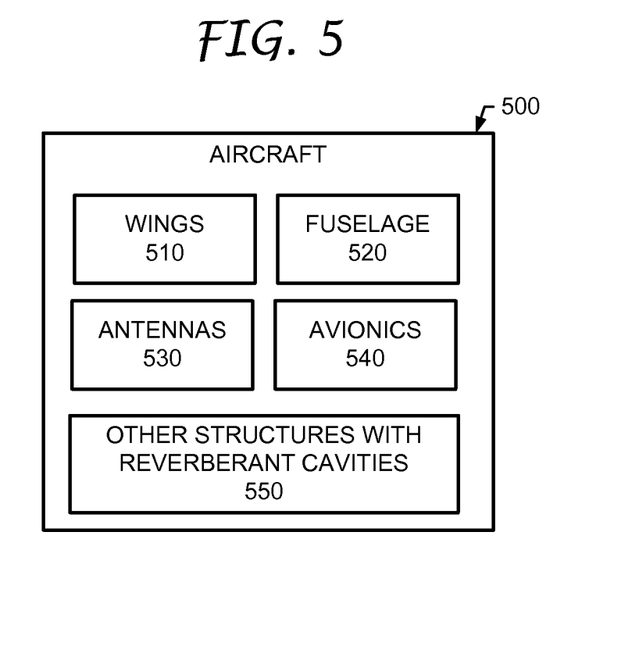
FIG. 5 is an illustration of an aircraft including structures with complex reverberant cavities.

FIG. 5 is an illustration of an aircraft 500 including aircraft structures with reverberant cavities having different geometry and composition. The composition could include metal (e.g., aluminum, titanium, alloys thereof), composite material (e.g., carbon fiber reinforced plastic), or other electrically conductive material.

The aircraft structures include wings 510. Each wing 510 includes ribs, spars, stringers and skin panels that form a wing box. The ribs form partitioned cavities within the wing box. Each partitioned cavity may have minimum dimensions of one or more wavelengths in the frequency of interest. Volume of the partitioned cavities decreases from root to tip. Shapes of the partitioned cavities may change from root to tip of the wing 510. Electromagnetic coupling between the partitioned cavities may be unknown or very difficult to measure.

Loss mechanisms may include resistive losses mostly in surfaces.

The wing box cavity may contain dynamic loss mechanisms. For instance, the wing box cavity may form a fuel tank. As fuel is consumed during flight, the level of the fuel in the tank changes. The fuel itself has some loss.

In addition, the shape of the wings 510 may change during flight. The wings 510 can flex during flight, which can change the geometry of and coupling between the partitioned cavities. The estimation of Q according to the method of FIG. 1 can account for these dynamics.

Q may vary spatially within a wing box cavity. The method of FIG. 1 can be used to estimate Q at one or more partitioned cavities.

The aircraft structures also includes a fuselage 520 made of frame members, floor beams, stiffeners and skin. These elements also form a large reverberant cavity that is partitioned into smaller cavities, such as the aircraft cabin, cockpit, galley, electrical equipment bay, and cargo compartment. The aircraft cabin, for instance, includes loss mechanisms including, but not limited to, apertures for windows and doors, seats, people, and wireless device antennas that absorb energy. Many of these losses are dynamic: people move within the fuselage, doors are opened and closed, and wireless devices are switched on and off. The aircraft cabin may be electromagnetically coupled to some of the other partitioned cavities.

The method of FIG. 1 can be used to estimate Q within the aircraft cabin. It may also be used to estimate Q within any of the other partitioned cavities in the fuselage 520.

The aircraft 500 further includes a plurality of radiating elements 530 for transmitting excitation frequencies and receiving reverberant energy.

The aircraft 500 further includes avionics 540. The avionics 540 may be located in electrical equipment (EE) Bay. The avionics 540 may utilize the method of FIG. 1 to perform real time estimation of Q in the aircraft.

Figure 6:
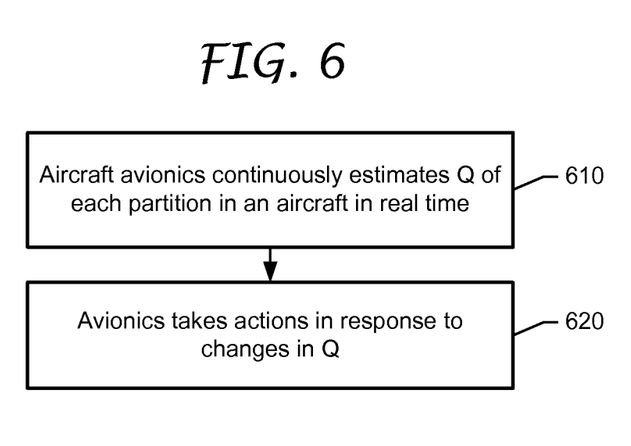
FIG. 6 is an illustration of a method of estimating and using Q in real time in an aircraft.

Additional reference is made to FIG. 6. At block 610, the avionics continuously estimates Q of each of the partitioned cavities within the wings 510 and fuselage 520 in real time. At block 620, the avionics takes actions in response to changes in estimated Q.

As a first example, Q of a fuel tank is monitored. The fuel itself has some loss, so if all other things are equal, a wing 510 with an empty fuel tank has a higher Q than a wing 510 with a full tank. Q may be monitored during defuel and refuel and compared to known baselines of an empty tank and a full tank. Changes in Q during flight may be used to determine fuel level. Such monitoring of Q may be used as a back to a fuel quantity indication system (FQIS), or it may be used as a replacement for FQIS.

As a second example, Q of the fuselage 520 may be monitored. Changes in Q may be used to detect doors opened and closed doors, and it may be used to detect people moving in and out of the fuselage 520.

As a third example, real-time estimation and monitoring of Q may be used to check structural health of the aircraft 500. Structural anomalies or defects (e.g., large holes) may introduce loss mechanisms, which changes the Q. These changes may be used to monitor structural health. Flight or ground crews may be alerted as to changes in the structural health.

Q-based structural health monitoring may be performed on aircraft structures that are used to enhance wireless data communication as described in the assignee's U.S. Pat. No. 8,026,857. The '857 patent describes wireless buses that use cavities as waveguides or resonators to propagate data and power. If a cavity is being used to propagate power or a signal, Q of that cavity may be monitored. Examples of aircraft structures 550 that may be used to propagate power or signal includes, without limitation, environmental control system (ECS) ducts, tubes of fuel and hydraulics systems, and nacelles and pylons of propulsion systems. Changes in Q of these structures may be monitored.

Figure 7:
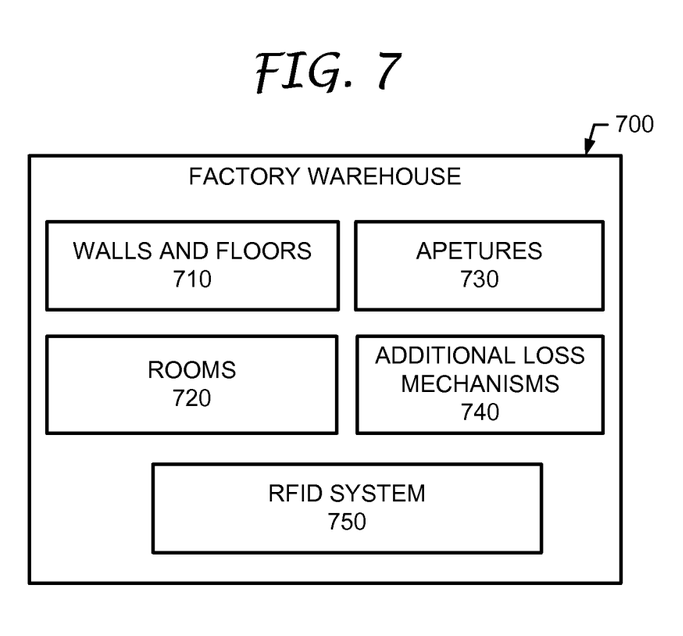
FIG. 7 is an illustration of a manufacturing warehouse including a complex reverberant cavity.

Reference is now made to FIG. 7, which illustrates a different type of structure having a complex cavity: a factory warehouse 700. The factory warehouse 700 has walls and floors 710 of different materials and thickness. The factory warehouse 700 has different rooms (partitioned cavities) 720, which may be electromagnetically coupled. The factory warehouse 700 also has apertures 730 such as doors and windows, which are opened and closed. The factory warehouse 700 also contains objects of different sizes and materials, which provide additional loss mechanisms 740. Some of these objects (people, carts) are mobile within the factory warehouse. Other objects, such as large tools, might be stationary but change configuration during operation. Thus, Q of the factory warehouse 700 is difficult to measure due to mixed or unknown material types, leakage through apertures, coupling into neighbouring environments, movement of loss mechanisms, etc.

An RFID system 750 is being proposed for the factory warehouse 700. The RFID system 750 will includes tags and readers for keeping track of assets (e.g., tools, materials, products) within the factory warehouse 700. The readers will be placed at various locations in the warehouse 700, and the tags will be secured to the assets.

Estimates of Q may be taken for different frequencies of interest, and the estimates may be taken at different locations in the warehouse 700. These estimates may be used to design and integrate the RFID system 750. For example, the Q may suggest how many readers are needed. A higher Q may suggest that fewer readers are needed since coverage zone is increased. Q may also be used to select locations of the readers.

The Q may be used to select a carrier frequency, data rate and protocol. For example, a high Q cavity means energy is stored longer and that reflections can couple back into receiver and cause interference. If the data rate is very fast, the fields will not have adequate time to settle before the next symbol is transmitted, whereby interference occurs. Knowledge of Q may force the decision to lower the data rate of the system 750 or increase its sophistication to handle late time reflections.

The invention claimed is:

1. A method comprising:
    collecting a data set of field characterization measurements at a network analyzer collected via an antenna located inside a reverberant cavity excited by signals having multiple discrete electromagnetic frequencies, the reverberant cavity including a fuel tank of an aircraft;
    performing a number (n) of circular shifts on the data set by a frequency step ($\Delta f$) and computing a covariance-based coefficient at each shift until the coefficient indicates a lack of correlation;
    computing a quality factor (Q) of the reverberant cavity as $fc/(\Delta f \times n)$, where fc is a center frequency of the data set; and
    determining a fuel level in the fuel tank based on the Q of the reverberant cavity.

2. The method of claim 1, wherein collecting the data set includes measuring s-parameters at the location and computing power measurements based on transmission coefficient $S_{21}$.

3. The method of claim 1, wherein the covariance-based coefficient is a correlation coefficient.

4. The method of claim 1, wherein the covariance-based coefficient is a Pearson product-moment correlation coefficient.

5. The method of claim 1, wherein the shifts are performed until the coefficient is less than $(1/e)$.

6. The method of claim 1, wherein the frequency step ($\Delta f$) is less than a resonant mode bandwidth of the cavity.

7. The method of claim 1, wherein collecting the data set includes analyzing the reverberant cavity with an n-port network analysis machine.

8. The method of claim 1, wherein collecting the data set includes placing first and second antennas at the location in the cavity; and using a network analysis machine to apply excitation signals to the antennas and to receive signals from the antennas, compute the data set, perform the circular shifts, and compute the quality factor.

9. The method of claim 1, wherein additional power measurements are taken at additional locations in the cavity; and for each additional location, the corresponding data set is circularly shifted and Q is computed.

10. The method of claim 1, wherein additional field characterization measurements are taken at additional antenna locations in the cavity; and wherein Q is computed for each of the locations.

11. The method of claim 1, wherein the circular shifts are performed on a segment of the data set, the segment centered at a frequency of interest; and wherein Q is estimated for the segment.

12. The method of claim 11, further comprising estimating Q for a segment centered at a different frequency of interest; and comparing the Qs of the two segments.

13. The method of claim 12, wherein the different frequencies of interest correspond to wireless systems having different carrier frequencies; and wherein one of the systems is selected according to the comparison of the Qs.

14. The method of claim 1, wherein the cavity includes a plurality of partitions of varying sizes and unknown electromagnetic coupling.

15. The method of claim 14, wherein the cavity is formed by an aircraft wing, and wherein the wing includes a plurality of dynamic loss mechanisms.

16. The method of claim 15, wherein determining the fuel level in the fuel tank based on the Q level of the reverberant cavity comprises continuously estimating the Q of the reverberant cavity in real time and comparing the estimated Q to a baseline value for the reverberant cavity that is indicative of a known fuel level in the fuel tank.

17. The method of claim 16, wherein continuously estimating the Q of the reverberant cavity in real time comprises continuously estimating the Q of the reverberant cavity during flight of the aircraft.

18. The method of claim 16, wherein continuously estimating the Q of the reverberant cavity in real time comprises continuously estimating the Q of the reverberant cavity while the fuel tank is filled with fuel.

19. An aircraft comprising:
    a structure having a complex reverberant cavity including a fuel tank;
    a plurality of antennas in the cavity; and
    aircraft avionics configured to:
        use the antennas to excite the cavity with signals having multiple discrete electromagnetic frequencies and obtain data sets of field characterization measurements for the cavity;
        perform a number (n) of circular shifts on the data set by a frequency step ($\Delta f$) and compute a covariance-based coefficient at each shift until the coefficient indicates a lack of correlation;
        compute a quality factor (Q) of the cavity as $fc/(\Delta f \times n)$, where fc is a data set center frequency; and
        determine a fuel level in the fuel tank based on the Q of the cavity.

20. A network analysis machine for analyzing a reverberant cavity provided on an aircraft, the reverberant cavity including a fuel tank, the machine comprising:
    a signal generator for generating signals on first and second ports that excite the cavity at multiple discrete electromagnetic frequencies;
    a receiver for reading signals on the first and second ports; and
    a processor programmed to:
        process the received signals to collect a data set of power measurements at the location;
        perform a number (n) of circular shifts on the data set by a frequency step ($\Delta f$) and compute a covariance-based coefficient at each shift until the coefficient indicates a lack of correlation;

compute a quality factor (Q) of the reverberant cavity as $fc/(\Delta f \times n)$, where fc is a center frequency of the data set; and determine a fuel level in the fuel tank based on the Q of the cavity.

\* \* \* \* \*

UNITED STATES PATENT AND TRADEMARK OFFICE
CERTIFICATE OF CORRECTION

PATENT NO.        : 10,585,971 B2
APPLICATION NO.   : 13/969715
DATED             : March 10, 2020
INVENTOR(S)       : Jason P. Bommer et al.

It is certified that error appears in the above-identified patent and that said Letters Patent is hereby corrected as shown below:

In the Claims

At Column 7, Line 30, delete the word "at" and substitute therefore --by--
At Column 7, Line 33, delete the word "including" and substitute therefore --comprising--
At Column 7, Line 37, add --circular-- before the word "shift"
At Column 7, Line 37, add --covariance-based-- before the word "coefficient"
At Column 7, Line 45, delete the word "the" and substitute therefore --a--
At Column 7, Line 53, add --circular-- before the word "shifts"
At Column 7, Line 54, add --covariance-based-- before the word "coefficient"
At Column 7, Line 56, add --reverberant-- before the word "cavity"
At Column 7, Line 61, delete the words "the location" and substitute therefore --locations--
At Column 7, Line 62, add --reverberant-- before the word "cavity"
At Column 7, Line 62, delete the word "a" and substitute therefore --the--
At Column 7, Line 62, delete the words "analysis machine" and substitute therefore --analyzer--
At Column 7, Line 63, add --first and second-- before the word "antennas"
At Column 7, Line 64, add --first and second-- before the word "antennas"
At Column 7, Line 67, add --reverberant-- before the word "cavity"
At Column 8, Line 2, add --the-- before the word "Q"
At Column 8, Line 5, add --reverberant-- before the word "cavity"
At Column 8, Line 5, add --the-- before the word "Q"
At Column 8, Line 6, add --additional antenna-- before the word "locations"
At Column 8, Line 8, add --first-- before the word "segment"
At Column 8, Line 8, add --first-- before the word "segment"
At Column 8, Line 9, add --first-- before the word "frequency"
At Column 8, Line 9, add --the-- before the word "Q"
At Column 8, Line 10, add --first-- before the word "segment"
At Column 8, Line 12, add --the-- before the word "Q"
At Column 8, Line 12, add --second-- before the word "segment"
At Column 8, Line 12, add --second-- before the word "segment"
At Column 8, Line 12, delete the word "different" and substitute therefore --second--

Signed and Sealed this
Tenth Day of November, 2020

Andrei Iancu
*Director of the United States Patent and Trademark Office*

CERTIFICATE OF CORRECTION (continued)
U.S. Pat. No. 10,585,971 B2

At Column 8, Line 13, delete the words "two segments" and substitute therefore --first segment and the second segment--
At Column 8, Line 14, delete the words "different frequencies" and substitute therefore --first frequency of interest and the second frequency--
At Column 8, Line 16, add --wireless-- before the word "systems"
At Column 8, Line 18, add --reverberant-- before the word "cavity"
At Column 8, Line 21, add --reverberant-- before the word "cavity"
At Column 8, Line 22, add --aircraft-- before the word "wing"
At Column 8, Line 25, delete the word "level" before the word "Q"
At Column 8, Line 39, delete the word "including" and substitute therefore --comprising--
At Column 8, Line 41, add --reverberant-- before the word "cavity"
At Column 8, Line 43, add --plurality of-- before the word "antennas"
At Column 8, Line 43, add --reverberant-- before the word "cavity"
At Column 8, Line 45, add --to-- before the word "obtain"
At Column 8, Line 45, add --a-- before the word "data"
At Column 8, Line 45, delete the word "sets" and substitute therefore --set--
At Column 8, Line 46, add --reverberant-- before the word "cavity"
At Column 8, Line 49, add --circular-- before the word "shift"
At Column 8, Line 49, add --covariance-based-- before the word "coefficient"
At Column 8, Line 51, add --reverberant-- before the word "cavity"
At Column 8, Line 52, delete the words "data set" before the word "center"
At Column 8, Line 52, add --of the data set-- after the word "frequency"
At Column 8, Line 54, add --reverberant-- before the word "cavity"
At Column 8, Line 57, delete the word "including" and substitute therefore --comprising--
At Column 8, Line 57, add --network analysis-- after the word "the"
At Column 8, Line 59, add --reverberant-- before the word "cavity"
At Column 8, Line 65, delete the word "the" and substitute therefore --a--
At Column 9, Line 1, add --circular-- before the word "shift"
At Column 9, Line 1, add --covariance-based-- before the word "coefficient"
At Column 9, Line 7, add --reverberant-- before the word "cavity"